(12) United States Patent
Manni

(10) Patent No.: US 9,966,723 B2
(45) Date of Patent: May 8, 2018

(54) HIGH PULSE ENERGY AND HIGH BEAM QUALITY MINI LASER

(71) Applicant: JGM Associates, Inc., Burlington, MA (US)

(72) Inventor: Jeffrey G. Manni, Burlington, MA (US)

(73) Assignee: JGM Associates, Inc., Burlington, MA (US)

( * ) Notice: Subject to any disclaimer, the term of this patent is extended or adjusted under 35 U.S.C. 154(b) by 413 days.

(21) Appl. No.: 14/947,181

(22) Filed: Nov. 20, 2015

(65) Prior Publication Data

US 2016/0336709 A1 Nov. 17, 2016

Related U.S. Application Data

(60) Provisional application No. 62/161,524, filed on May 14, 2015.

(51) Int. Cl.
*H01S 3/08* (2006.01)
*H01S 3/0941* (2006.01)
(Continued)

(52) U.S. Cl.
CPC ........ *H01S 3/08081* (2013.01); *H01S 3/0602* (2013.01); *H01S 3/0941* (2013.01);
(Continued)

(58) Field of Classification Search
CPC .. H01S 3/08081; H01S 3/0602; H01S 3/0941; H01S 3/094084; H01S 3/1103;
(Continued)

(56) References Cited

U.S. PATENT DOCUMENTS 4,360,925 A * 11/1982 Brosnan .............. H01S 3/08081
372/108
4,559,627 A * 12/1985 Chun ................... H01S 3/0606
372/103
(Continued)

FOREIGN PATENT DOCUMENTS

WO 2007033432 A1 3/2007
WO WO 2007033432 * 3/2007 ............... H01S 3/08
(Continued)

OTHER PUBLICATIONS

Written Opinion of the International Searching Authority, dated Jul. 25, 2016 in International Application No. PCT/US16/029296, eight (8) pages (unnumbered).
(Continued)

*Primary Examiner* — Xinning Niu
(74) *Attorney, Agent, or Firm* — Iandiorio Teska & Coleman, LLP

(57) ABSTRACT

A laser including a solid state laser gain medium having a D-shaped cross section and an unstable resonator laser cavity including the solid state laser gain medium configured with a geometric magnification in a range of 1 to 5 under the intended operating conditions, including the effects of thermal lensing in the gain medium. An optical switching device in the unstable resonator laser cavity generates a pulse duration in the range of 0.05 to 100 nanoseconds. A diode-pump source is configured to inject pump light through the curved or barrel surface of the D-shaped gain medium.

38 Claims, 3 Drawing Sheets

(51) Int. Cl.

| | |
|---|---|
| H01S 3/06 | (2006.01) |
| H01S 3/115 | (2006.01) |
| H01S 3/117 | (2006.01) |
| H01S 5/40 | (2006.01) |
| H01S 3/094 | (2006.01) |
| H01S 3/11 | (2006.01) |
| H01S 3/16 | (2006.01) |

(52) U.S. Cl.
CPC ......... *H01S 3/0615* (2013.01); *H01S 3/08072* (2013.01); *H01S 3/09408* (2013.01); *H01S 3/094084* (2013.01); *H01S 3/1103* (2013.01); *H01S 3/115* (2013.01); *H01S 3/117* (2013.01); *H01S 3/1115* (2013.01); *H01S 3/1603* (2013.01); *H01S 5/4025* (2013.01)

(58) Field of Classification Search
CPC ............. H01S 3/08072; H01S 3/09408; H01S 3/1603; H01S 3/1115; H01S 3/0615; H01S 3/115; H01S 3/117; H01S 5/4025
See application file for complete search history.

(56) References Cited

U.S. PATENT DOCUMENTS

| | | | | |
|---|---|---|---|---|
| 5,761,227 | A * | 6/1998 | Hargis | .................... H01S 3/042 372/22 |
| 5,943,358 | A * | 8/1999 | Allik | .................. H01S 3/08081 372/101 |
| 6,072,811 | A | 6/2000 | Fermann et al. | |
| 2004/0057475 | A1* | 3/2004 | Frankel | ............... H01S 3/06754 372/25 |
| 2004/0066805 | A1* | 4/2004 | Afzal | .................... H01S 3/0606 372/10 |
| 2005/0185691 | A1 | 8/2005 | Slater | |
| 2008/0037597 | A1* | 2/2008 | Mason | .................. H01S 3/0602 372/13 |
| 2009/0161703 | A1* | 6/2009 | Seelert | .................... H01S 3/109 372/22 |
| 2011/0305256 | A1* | 12/2011 | Chann | ................ G02B 27/0905 372/75 |
| 2012/0093179 | A1* | 4/2012 | Dunn | .................... H01S 3/0823 372/21 |

FOREIGN PATENT DOCUMENTS

| | | | |
|---|---|---|---|
| WO | 2008016287 A1 | 2/2008 | |
| WO | WO 2008016287 | * 2/2008 | ............. H01S 3/098 |

OTHER PUBLICATIONS

Ajer et al., "Efficient Diode-Laser Side-Pumped $TEM_{00}$ -mode Nd:YAG Laser", Optics Letters, Optical Society of America, Dec. 15, 1992, vol. 17, No. 24, pp. 1785-1787.

Welford et al., "Efficient $TEM_{00}$ -Mode Operation of a Laser-Diode Side-Pumped Nd:YAG Laser", Optics Letters, Optical Society of America, Dec. 1, 1991, vol. 16, No. 23, pp. 1850-1852.

Welford et al., "Observation of Enhanced Thermal Lensing Due to Near-Gaussian Pump Energy Deposition in a Laser-Diode Side-Pumped Nd:YAG Laser", IEEE Journal of Quantum Electronics, Apr. 1992, vol. 28, No. 4, pp. 1075-1080.

Isyanova et al., "Temporal Criterion for Single-Frequency Operation of Passively Q-Switched Lasers", Optics Letters, Optical Society of America, Aug. 1, 1999, vol. 24, No. 15, pp. 1035-1037.

Isyanova et al., "2.4-ns Pulse Generation in a Solid-State, Passively Q-Switched, Laser-Diode-Pumped Nd:YAG Laser", OSA Proceedings on Advanced Solid-State Lasers, Optical Society of America, 1993, vol. 15, pp. 20-23.

Hodgson et al., "Chapter 7, Unstabte Resonators", Laser Resonators and Beam Propagation, $2^{nd}$ Edition, Springer 2005, pp. 295-340, plus cover pages and Table of Contents (total of 55 pages).

* cited by examiner

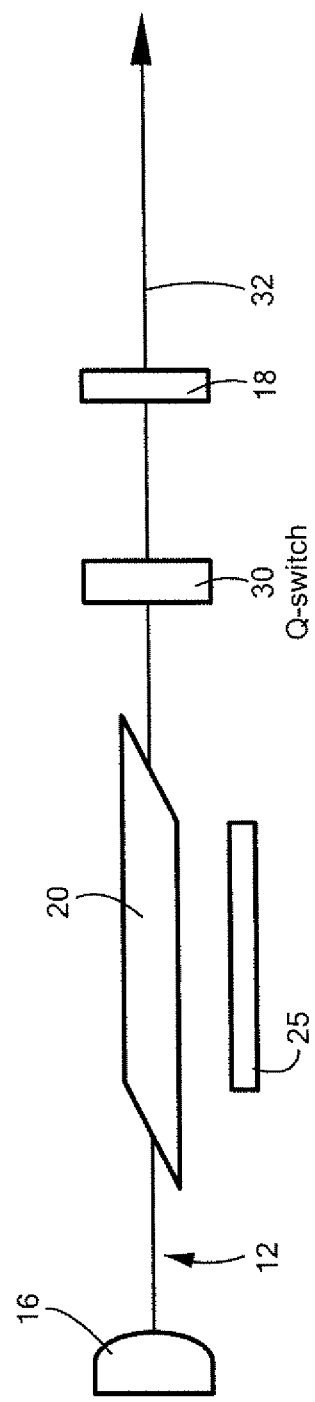
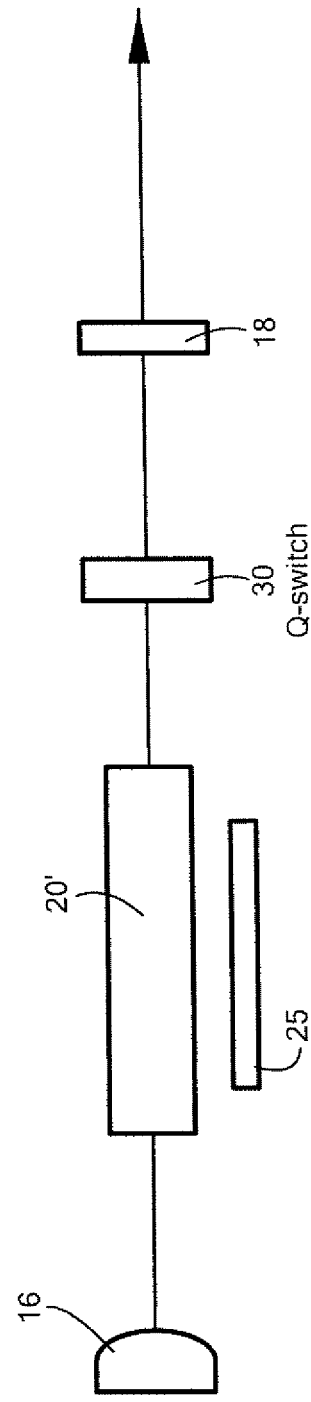
FIG. 1A
FIG. 1B

HIGH PULSE ENERGY AND HIGH BEAM QUALITY MINI LASER

RELATED APPLICATIONS

This application claims benefit of and priority to U.S. Provisional Application Ser. No. 62/161,524 filed May 14, 2015, under 35 U.S.C. § § 119, 120, 363, 365, and 37 C.F.R. § 1.55 and § 1.78, which is incorporated herein by this reference.

FIELD OF THE INVENTION

The subject invention relates to lasers, for example a laser used in a handheld LIBS analyzer.

BACKGROUND OF THE INVENTION

In a laser induced breakdown spectroscopy system, a laser is used to generate a plasma or spark on a sample surface. Electromagnetic radiation from the plasma is analyzed using a spectrometer to determine the elemental makeup of the sample. Thus, the brighter the plasma, the stronger the signal which can be analyzed. A high-peak-power, Q-switched, stable-resonator laser is typically used or desired in LIBS systems. But, in portable hand carried LIBS devices, a stable resonator design can occupy too much space due to a long laser cavity or resonator length.

SUMMARY OF THE INVENTION

Featured is a laser configured as an unstable resonator to reduce the size, complexity, and cost of the laser. The laser may be used in LIBS systems, in other optical emission spectroscopy applications, and in other laser based systems.

A gain medium with a D-shaped cross section in combination with the unstable resonator configuration produces a laser beam which can be focused to very small diameter spot size (e.g., 10 to 50 microns) as needed to produce a strong LIBS signal. The result is a focal laser beam spatial profile well suited to generating an optical signal for LIBS analyzers, especially portable and handheld models.

Featured is a laser comprising a laser cavity configured as an unstable resonator with a geometric magnification in the range of 1 to 5. A solid state laser gain medium with a D-shaped cross section is located in the laser cavity. An optical pumping source is disposed to inject optical pump energy into the gain medium.

The resonator cavity may be configured as a non-confocal unstable resonator or as a confocal or near-confocal unstable resonator. The solid state laser gain medium may include at least one Brewster-angled end face or two Brewster-angled end faces.

The laser may further include an optical switching device configured to generate a pulse duration in the range of 0.05-100 nanoseconds, for example. In one example, the optical switching device is a Cr:YAG passive Q-switch. In other designs, the optical switching device is an electro-optic Pockels cell configured as a Q-switch, an electro-optic Pockels cell configured as a cavity dumper, or an acousto-optic Q-switch if the switch has an adequately fast switching time.

Preferably, the optical pumping source includes at least one laser diode array configured to side pump the laser rod having a D-shaped cross section. There may be a plurality of laser diode arrays disposed on and extending along a curved face or barrel surface of the laser gain medium.

The laser may be configured to generate at least one emission wavelength in the range of 900-1100 nm in which case the gain medium may be made from Nd:YAG, Nd:YVO4, Nd:YLF or Nd:GdVO4; the laser may be configured to generate at least one emission wavelength in the range of 1500-1700 nm in which case the gain medium may be made of Er:YAG, Er:YVO4, Er:YLF or Er:GDVO4; the laser may be configured to produce at least one emission wavelength in the range of 1800-2200 nm in which case the gain medium may be made of Tm:YAG, Tm:YVO4, Tm:YLF, or Tm:LuAG; or the laser may be configured to generate at least one emission wavelength in the range of 400-700 nm in which case the gain medium may be made of Pr:YLF.

Preferably, the laser is configured to generate at least 1 millijoule per pulse. The laser resonator cavity may be configured as an unstable resonator in only one transverse optical plane and a stable resonator in an orthogonal transverse plane, or as unstable resonator in both transverse planes with equal or different magnification in the two planes. In one design, the unstable resonator is configured as an unstable resonator in a transverse optical plane and an orthogonal transverse plane. The laser cavity may be defined by an output coupler mirror with a flat configuration and a convex highly reflective mirror spaced from the output coupler mirror with the solid state laser gain medium disposed between the mirrors. In one embodiment, the mirrors are spaced between about 25 mm and 50 mm apart.

Also featured is a laser comprising a solid state laser gain medium having a substantially D-shaped cross section, an unstable resonator laser cavity including the solid state laser gain medium configured with a geometric magnification in a range of 1 to 5, an optical switching device in the unstable resonator laser cavity generating a pulse duration in the range of 1 to 5 nanoseconds, and a plurality of laser diode arrays on a curved barrel surface of the substantially D-shaped cross-section laser gain medium for injecting optical pump energy into the gain medium.

The subject invention, however, in other embodiments, need not achieve all these objectives and the claims hereof should not be limited to structures or methods capable of achieving these objectives.

BRIEF DESCRIPTION OF THE SEVERAL VIEWS OF THE DRAWINGS

Other objects, features and advantages will occur to those skilled in the art from the following description of a preferred embodiment and the accompanying drawings, in which:

FIGS. 1A-1B are schematic diagrams showing the primary components associated with examples of a laser in accordance with the invention;

DETAILED DESCRIPTION OF THE INVENTION

Figure 2:
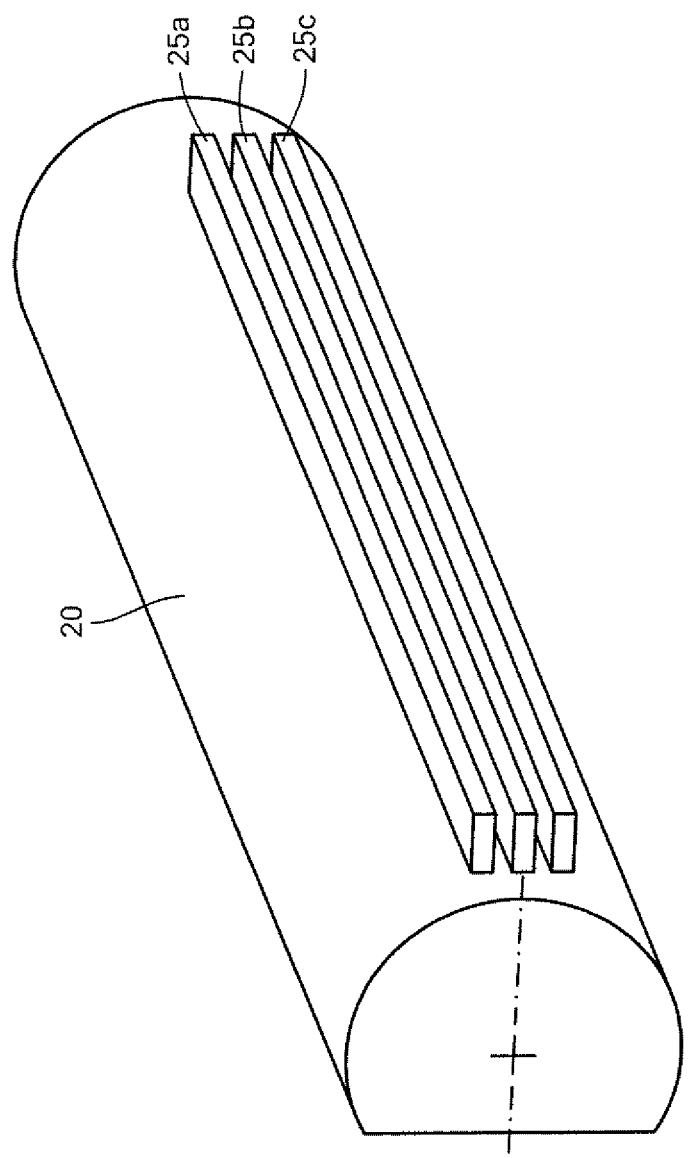
FIG. 2 is a schematic view showing the gain medium of FIG. 1 with a laser diode pumping sources co-located therewith.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

In one example, laser 10, FIG. 1A includes a geometrically unstable non-confocal laser cavity 12 comprised of mirror 14 and mirror 16. Cavity 12 may be less than 50 mm in length and is thus well suited for smaller hand held LIBS devices. In this particular example, mirror 14 is the output coupler mirror with a flat configuration. Inside face 18 is 40% reflective at the wavelength of interest (e.g., 1064 nm). Mirror 16 may be a convex highly reflective mirror. Other optical configurations are possible to produce an unstable resonator cavity (typically having a magnification of 1 to 5). See, for example, Laser Resonators and Beam Propagation, 2nd edition, N Hodgson and H. Weber, Springer 2005, Chapter 7 "Unstable Resonators" incorporated herein by this reference.

A gain medium resides in the cavity such as a Brewster-Angled Nd laser rod 20 with a "D" shape or substantially D-shaped cross section. The Brewster ends may be eliminated in some embodiments as shown in FIG. 1B. See Isyanova and Welford, 2.4 ns *Pulse Generation in a Solid-State Passively Q-Switch, Laser-Diode Pumped Nd YAG Laser*, OSA Proceeding on Advanced Solid-State Lasers, 1993, Vol. 15, pages 20-23; Welford, Rines, and Dinerman, *Efficient $TEM_{00}$-Mode Operation of a Laser-Diode Side-Pumped Nd: YAG Laser*, Optics Letters, Vol. 16 No. 23, Dec. 1, 1991, pages 1850-1853; Ajer, Landrø, Rustad and Stenersen, *Efficient Diode-Laser Side-Pumped $TEM_{00}$-Mode NdYAG Laser*, Optic Letters, Vol. 17, No. 24, Dec. 15, 1992, pages 1785-1787; Welford, Rines, Dinerman, and Martinsen, *Observation of Enhanced Thermal Lensing Due to Near-Gaussian Pump Energy Deposition in a Laser-Diode Side-Pumped Nd: YAG Laser*, IEEE Journal of Quantum Electronics, Vol. 28, No. 4 April 1992, pages 1075-1080; and Isyanova and Welford, *Temporal Criterion for Single-Frequency Operation of a Passively Q-Switched Lasers*, Optics Letters, Vol. 24, No. 15, Aug. 1, 1999, pages 1035-1037, all incorporated herein by this reference.

In FIG. 1B, D-rod 20' does not include Brewster ends. A pump source 25 is shown in FIGS. 1A and 1B and may include one or more laser diode arrays (808 nanometer wavelength). As shown in FIG. 2, three 10 mm long spaced diode arrays 25a-25c are located to extend along the curved face of a 13 mm long Nd D-rod 20 to side pump the laser rod. Thus, the linear diode arrays extend along a majority (e.g., ⅔) of the length of the D-rod. Each diode bar 25 may be spaced ½ mm from the curved face of the rod and each bar may be separated from an adjacent bar by ½ mm. The bars may be housed in a package. The D-rod may have a diameter of 3.5 mm and 1.75 mm radius, for example. The diode arrays "bars" used to side-pump the D-rod need not have microlenses for fast-axis collimation and the bars may be spaced with a pitch of 0.4 mm for example.

Diode-pump light is injected into the D-shaped laser gain medium through the curved or barrel surface of the D-rod. In one preferred embodiment, the barrel surface is polished and anti-reflection (AR) coated at the diode-pump wavelength, but the AR coating is not necessary. The barrel surface may be a "ground" surface, as is often done for solid-state laser rod barrels, but the laser may not operate as efficiently as with a polished barrel surface.

The injected diode-pump light may be generated by a single laser diode array "bar" or a plurality of laser diode bars configured as a 2D array of laser diode bars. Alternatively, pump light may be generated by one single-emitter laser diode, or a horizontal array of single-emitter laser diodes configured along the length of the D-rod.

Passive Q-switch 30 may also be included but active Q-switches are also possible. In this example with a passive Cr:YAG Q-switch, diode arrays 25a-25c, FIG. 2 are pulsed at 200 microseconds and the resulting Q-switched laser pulse 32 has a pulse width of 2 nanoseconds and generates at least 1 millijoule per pulse. Other switches are possible and the switch could be located on the other side of gain medium 20 or even integrated into the gain medium as in co-doped Nd,Cr:YAG materials. The Q-switch acts to generate a short (few nanoseconds) and high-peak-power laser pulse even though a long diode-pump pulse is used to optically excite the laser gain medium. A 5 mJ output beam 32 may have a wavelength of 1064 nm directed to a focusing lens which may be a component of the laser or a LIBS system or other device. A high intensity small diameter focal spot (e.g., 10 to 50 microns) is produced. Such a focused beam profile has been demonstrated to result in a laser-generated plasma and optical signal that is well suited for use in laser-induced breakdown spectroscopy (LIBS) instruments.

The result is a laser configured as an unstable resonator to reduce the size, complexity, and cost of the laser. The gain medium with a D-shape cross section in combination with the unstable resonator configuration produces a laser beam which can be focused to a very small diameter spot size for a strong LIBS signal.

The laser may be configured with an unstable resonator laser cavity in one or both transverse planes including a D-rod gain medium. Unstable resonator magnification may have different values in the two orthogonal planes. Unstable resonator magnification may be the same or different in transverse orthogonal planes. Typically, laser operates as a non-confocal unstable resonator. The result is good beam quality and high pulse energy with a short pulse duration as compared to some stable resonator designs. The result is a fairly simple, low part count, less costly design. The laser beam produced can be focused to a small spot size that will break down air.

The distance between mirror 16 and 18 (the laser cavity) and the type and curvatures of the mirrors are chosen to produce an unstable resonator laser cavity having a geometric magnification in the range of 1-5 in the presence of thermal lensing of the D-rod. Mirror 16 may be one meter convex. The distance between mirror 16 and 18 may be 35 mm. As a result, thermal lensing in the D-rod gain medium is compensated for such that the laser operates as a non-confocal unstable resonator with magnification in the range of 1 to 5. In another confocal or near confocal design, mirror 18 is convex and mirror 16 is concave.

In FIGS. 1A-1B, the mirrors are axially symmetric (e.g., spherical or round). If the resonator is geometrically unstable in one plane and geometrically stable in the orthogonal plane, then the resonator mirrors may be cylindrical, or anamorphic, rather than spherical.

Emission beam quality ($M^2$) may be in the range of 2 to 5, for example, but may be between 1 and 5. A diffraction-limited beam has $M^2=1$ value. Beam quality ($M^2$) for an unstable resonator is typically no better than (no less than)

2 and may be somewhat larger than 2 (2 to 5 for example) due to diffraction effects at limiting apertures in the laser resonator.

For lasers with resonators that are geometrically stable in the one transverse plane, beam quality may be as good as $M^2=1$ in the stable plane, and as good as $M^2=2$ in the unstable plane.

If the D-shaped gain medium is made of Nd:YAG, Nd:YVO4, Nd:YLF or Nd:GdVO4, at least one emission wavelength may be in the range of 900 to 1100 nm. If the laser rod is made of Er:YAG, Er:YVO4, Er:YLF or Er:GVO4, at least one emission wavelength may be in the range of 1500 to 1700 nm. If the laser rod is made of Tm:YAG, Tm:YVO4, Tm:YLF, or Tm:LuAG, at least one emission wavelength may be in the range of 1800 to 2200 nm. If the laser rod is made of Pr:YLF at least one emission wavelength may be in the range of 400 to 700 nm.

Q-switch 30 may be active or passive. Preferably, the Q-switch generates a pulse duration in the range of 0.05 to 100 nanoseconds. In other designs, the optical switching device is a Cr:YAG passive Q-switch, an electro-optic Pockels cell configured as a Q-switch or cavity dumper or an acousto-optic Q-switch if the active switch has an adequately fast switching time.

The invention may include a laser resonator that is geometrically unstable in at least one transverse optical plane and with a magnification in the range of 1 to 5 under the intended operating conditions; that is, taking into account any thermal lensing present in the diode-pumped D-rod gain medium when the laser is operated as intended.

Whether or not the resonator is actually operating as an unstable resonator can be determined using the well-known "knife-edge method" in which a straight-edge beam block is inserted into the resonator (between the laser mirrors) from one side only. If the resonator is operating as an unstable resonator, then the laser output beam will clip from one side only and in the plane perpendicular to the straight-edge beam block. If the resonator is operating as a stable resonator, the laser output beam will clip simultaneously from both sides even though the straight-edge beam block is inserted from only one side.

In another embodiment, the D-rod is fabricated from a self Q-switching material such as Nd,Cr:YAG. A discrete separate Q-switch option is not needed in this case. Flat and curved surfaces may then be fabricated directly onto the ends of the D-rod as needed to realize an unstable resonator in at least one transverse plane. One end of the rod may be optically coated to make a high-reflector (HR) mirror, and the other end may be optically coated to make a partially-reflecting output coupler (OC) mirror. The resulting laser may produce high energy (1 mJ or more), with high beam quality, and with a very short pulse duration in the 0.1 to 1 ns range, for example.

Figure 3:
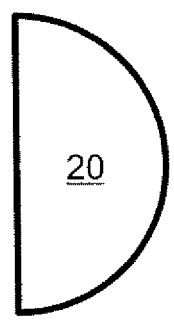
FIG. 3 is a cross sectional view of a D-shaped rod.
Figure 4:
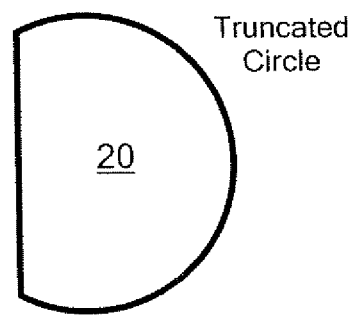
FIG. 4 is a cross sectional view of another D-shaped rod.

As used herein, a laser rod having a D-shaped cross section includes a laser rod with a substantially D-shaped cross-section. For example, in one preferred embodiment, the flat portion of the rod is fabricated along a diameter of the circular cross-section, thus dividing the rod in half as shown in FIG. 3. However, in another preferred embodiment, the flat portion may be along a chord of the circular cross-section as shown in FIG. 4 thereby creating a "truncated circle" cross-sectional shape.

A D-rod shape includes a curved or "barrel" surface which quasi-collimates the diode-pump light as it enters the rod from the side and may eliminate the need for and cost associated with attaching fast-axis (FAC) microlenses to the diode-pump array. The flat surface of the rod may be coated with a coating that is highly reflecting (HR) at the diode-pump wavelength. This flat surface acts as an HR mirror that back-reflects quasi-collimated diode-pump light back through the rod so that pump light makes a second pass through the rod. This improves conversion efficiency of the diode-pumped solid-state laser or amplifier for which the D-rod is the gain medium. The length of the flat portion should be substantially matched to the diameter of the diode-pump beam along that dimension which in turn is determined by the number of 1D array "bars" in the diode-pump array, the bar pitch or spacing, and the radius of circular portion of the rod cross-section. The flat surface also provides a surface for heat extraction from the laser rod (rod cooling) and the length of this flat surface, relative to the diameter of the collimated diode-pump beam, might be expected to control temperature gradients and refractive index gradients created in the laser rod by diode-pumping.

Figure 5:
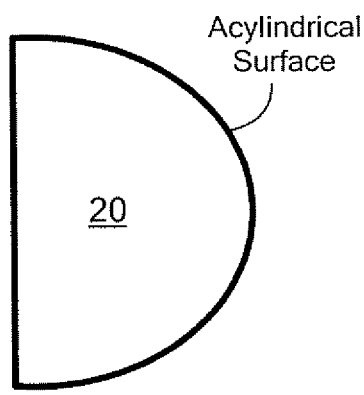
FIG. 5 is a cross sectional view of another D-shaped rod.
Figure 6:
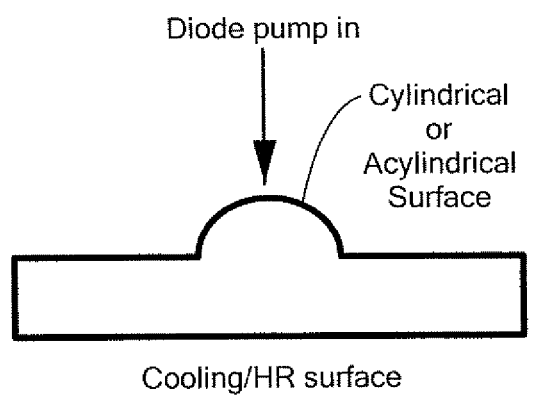
FIG. 6 is a cross sectional view of still another possible D-shaped rod configuration.

The D-shaped rod may be fabricated from a crystalline (single-crystal) laser material such as Nd:YAG using fabrication methods that are well-known in the field. However, the D-shaped laser rod may also be fabricated using ceramic Nd:YAG or other ceramic laser material which may be a high-optical-quality polycrystalline material rather than true single-crystal. The methods used to make ceramic laser materials tend themselves to making odd-shaped rods and slabs during the ceramic pressing and firing process. FIGS. 5-6 show odd-shaped gain mediums having a cross-section that has the essential features of a D-shaped rod and that might be made easily and at relatively low-cost using ceramic processing methods. Also, the ceramic process may enable making rod barrel surfaces that are aspheric, rather than spherical/circular, as may be expected to improve collimation of diode-pump light within the gain medium.

The invention lends itself to storing large amounts of energy in a short laser rod (tens of millijoules) and making lasers with very short laser resonator lengths that may be in the 10 to 20 mm range or shorter (if diode bars less than 10 mm wide are used). The high population inversions and therefore high laser gains that can be achieved, along with very short resonator lengths, potentially enable one to generate very short and high-energy Q-switched laser pulses, especially when using passive Q-switches rather than active Q-switches. (When using active Q-switching devices, the shortest pulse duration that can be produced is usually limited by how fast the active device can switch from a low-Q state to a high-Q-state). Calculations suggest that pulse durations in the 300 to 500 ps range should be possible when using materials such as Nd:YAG, and pulse durations in the 100 ps range (and maybe less) may be possible when using higher gain materials such as Nd:YVO$_4$. When combined with an unstable resonator in one or both transverse planes, such lasers might provide output pulse energies of 1 mJ or more, with pulse durations less than 500 ps (and maybe less than 100 ps), and with high beam quality.

The short resonator lengths possible (<50 mm) may also enable one to make single-frequency lasers such that the laser operates on (emission spectrum includes) only one longitudinal mode of the laser resonator (single longitudinal mode operation). Depending on the spectral bandwidth of the laser gain medium, a pulsed laser with such a short resonator length may operate on a single longitudinal mode for any one pulse that is generated, but the single-frequency emission spectrum may "hop" between adjacent or nearby longitudinal modes from one laser pulse to next. So, when averaged over many laser pulses, the laser emission may not be true single-frequency emission. However, by making the laser resonator very short, e.g., 10 mm or less, and with the actual required length depending on the spectral width of the laser gain material, one may realize true single-frequency emission such that every laser pulse operates on the same longitudinal mode.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments. Other embodiments will occur to those skilled in the art and are within the following claims.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

What is claimed is:

1. A laser comprising:
   a laser cavity configured as an unstable resonator with a geometric magnification in the range of 1 to 5 in at least one transverse plane;
   a solid state laser gain medium rod with a D-shaped cross section in the laser cavity; and
   an optical pumping source disposed to inject optical pump energy into the gain medium.

2. The laser of claim 1 in which the laser resonator cavity is configured as a non-confocal unstable resonator.

3. The laser of claim 1 in which the laser cavity is configured as a confocal or near-confocal unstable resonator.

4. The laser of claim 1 in which the solid state laser gain medium includes at least one Brewster-angled end face.

5. The laser of claim 4 in which the laser gain medium includes two Brewster-angled end faces.

6. The laser of claim 1 further including a passive or active optical switching device configured to generate a pulse duration in the range of 0.05-100 nanoseconds.

7. The laser of claim 6 in which the optical switching device is a Cr:YAG passive Q-switch.

8. The laser of claim 6 in which the optical switching device is an electro-optic Pockels cell configured as a Q-switch.

9. The laser of claim 6 in which the optical switching device is an electro-optic Pockels cell configured as a cavity dumper.

10. The laser of claim 6 in which the optical switching device is an acousto-optic Q-switch.

11. The laser of claim 1 in which the optical pumping source includes at least one laser diode configured to side pump the D-shaped laser rod.

12. The laser of claim 11 in which a plurality of laser diodes are disposed near and extend along a curved face of the D-shaped laser rod.

13. The laser of claim 1 in which the laser is configured to generate at least one emission wavelength in the range of 900-1100 nm.

14. The laser of claim 13 in which the gain medium is made from Nd:YAG, Nd:YVO4, Nd:YLF or Nd:GdV04.

15. The laser of claim 1 in which the laser is configured to generate at least one emission wavelength in the range of 1500-1700 nm.

16. The laser of claim 15 in which the gain medium is made of Er:YAG, Er:YVO4, Er:YLF or Er:GDV04.

17. The laser of claim 1 in which the laser is configured to produce at least one emission wavelength in the range of 1800-2200 nm.

18. The laser of claim 17 in which the gain medium is made of Tm:YAG, Tm:YV04, Tm:YLF, or Tm:LuAG.

19. The laser of claim 1 in which the laser is configured to generate at least one emission wavelength in the range of 400-700 nm.

20. The laser of claim 19 in which the gain medium is made of Pr:YLF.

21. The laser of claim 1 in which the laser is configured to generate at least 1 millijoule per pulse.

22. The laser of claim 1 in which the resonator laser cavity is configured as an unstable resonator in only one transverse optical plane and a stable resonator in a orthogonal transverse plane.

23. The laser of claim 1 in which the laser cavity is configured as an unstable resonator in a transverse optical plane and in an orthogonal transverse plane.

24. The laser of claim 1 in which the laser cavity is defined by an output coupler mirror with a flat configuration and a convex highly reflective mirror spaced from the output coupler mirror with the solid state laser gain medium disposed between said mirrors.

25. The laser of claim 24 in which said mirrors are spaced between 25 mm and 50 mm apart.

26. A laser comprising:
   a solid state laser gain medium rod having a D-shaped cross section;
   an unstable resonator laser cavity including the solid state laser gain medium configured with a geometric magnification in a range of 1 to 5;
   an optical switching device in the unstable resonator laser cavity for generating a pulse duration; and
   a plurality of laser diodes adjacent a curved surface of the D-shaped cross-section laser gain medium rod for injecting optical pump energy into the gain medium.

27. The laser of claim 26 in which the laser cavity is defined by an output coupler mirror with a flat configuration and a convex highly reflective mirror spaced from the output coupler mirror with the solid state laser gain medium disposed between said mirrors.

28. The laser of claim 27 in which said mirrors are spaced between 25 mm and 50 mm apart.

29. The laser of claim 26 in which the solid state laser gain medium includes at least one Brewster-angled end face.

30. The laser of claim 29 in which the laser gain medium includes two Brewster-angled end faces.

31. The laser of claim 26 in which the optical switching device is a passive Q-switch.

32. The laser of claim 26 in which the laser is configured to generate at least 1 millijoule per pulse.

33. The laser of claim 1 in which the optical pumping source is disposed to inject the optical pump energy into a curved barrel portion of the D-shaped cross section of the laser gain medium.

34. The laser of claim 33 in which the optical pump energy is light and the light is collimated by the curved barrel portion.

35. The laser of claim 34 in which the D-shaped cross section includes a flat portion which back-reflects the collimated light back through the laser gain medium such that the light makes a first pass through the laser gain medium and second pass through the laser gain medium in a direction opposite the first pass.

36. The laser of claim 26 in which the D-shaped cross section of the laser gain medium includes a curved barrel portion.

37. The laser of claim 36 in which in which the optical pump energy is light and the light is collimated by the curved barrel portion.

38. The laser of claim 37 in which the D-shaped cross section includes a flat portion which back-reflects the collimated light back through the laser gain medium such that the light makes a first pass through the laser gain medium and second pass through the laser gain medium in a direction opposite the first pass.

* * * * *